United States Patent [19]

Brown

[11] 4,204,168
[45] May 20, 1980

[54] SIGNAL CONVERTER USING A QUAD DIODE RACE

[75] Inventor: Kenneth L. Brown, Marion, Iowa

[73] Assignee: Rockwell International Corporation, El Segundo, Calif.

[21] Appl. No.: 840,210

[22] Filed: Oct. 7, 1977

[51] Int. Cl.² ............................................. H03C 1/58
[52] U.S. Cl. .................................. 455/330; 329/163; 332/47; 333/26; 455/331
[58] Field of Search .................. 325/446, 449, 445; 333/11, 25, 26, 117; 363/58, 59; 332/43 B, 47; 329/163, 166, 204, 50

[56] References Cited

U.S. PATENT DOCUMENTS

| | | | |
|---|---|---|---|
| 3,029,386 | 4/1962 | Ricker | 332/47 |
| 3,436,683 | 4/1969 | Rogers | 332/47 |
| 3,492,603 | 1/1970 | Fredrick, Jr. | 332/47 |
| 3,659,205 | 4/1972 | Cooke et al. | 333/26 |
| 3,679,975 | 7/1972 | Fein | 332/47 |
| 3,772,599 | 11/1973 | Ernst et al. | 325/446 |
| 3,793,592 | 2/1974 | Matonak et al. | 329/166 |
| 3,883,812 | 5/1975 | Harrison et al. | 329/166 |
| 3,913,037 | 10/1975 | Himono et al. | 325/446 |
| 4,032,850 | 6/1977 | Hill | 325/446 |

Primary Examiner—John C. Martin
Assistant Examiner—Joseph A. Orsino, Jr.
Attorney, Agent, or Firm—Richard A. Bachand; H. Fredrick Hamann

[57] ABSTRACT

A signal converter, and more particularly, a mixer includes a quad diode race or bridge having a first signal supplied to a first pair of input ports in a balanced state, and a second signal supplied to another pair of input ports in an unbalanced state. The unbalanced connection to the diode race is effected via connections to conducting strips of a printed circuit board, and the balanced connection is effected by a hybrid balun element. The output from the circuit is derived from an input to the balun, at a low signal level.

9 Claims, 2 Drawing Figures

SIGNAL CONVERTER USING A QUAD DIODE RACE

BACKGROUND OF THE INVENTION

1. Field of the Invention

This invention related to signal converters, and more particular to signal converters employing a quad diode race or bridge.

2. Description of the Prior Art

Representative of the techniques used in the prior art for achieving a doubly balanced microwave mixer is the patent of Neuf, U.S. Pat. No. 3,652,941. Among other things, Neuf teaches a doubly balanced mixer using two tapered microstrip constructed baluns for connection to a quad diode bridge. Electrically, a radio-frequency (RF) signal is coupled by one of the baluns to two of the corners of the bridge, and a local oscillator (LO) signal is coupled by the other balun to the other two corners of the bridge. Two pairs of RF chokes are used to remove the IF output signal from the diode bridge and to provide a dc return path.

Physically, the Neuf mixer is constructed with the diode bridge mounted in a hole in a substrate on which the microstrip baluns are formed. Connections to the diode bridge are achieved with some effort using specially placed leads to connect to the microstrip leads on opposite surfaces of the substrate adjacent the mounting hole where the microstrip leads terminate. The need for such multiple connections on opposite surfaces of the substrate is necessitated, in part, by the constraint (heretofore considered necessary) that the RF and LO signals be applied to the diode bridge in a balanced or floating state; in other words, that balun elements be used to couple the respective input signals to the diode bridge.

This seeming constraint dictating inputs to a quad diode bridge is further illustrated by the recently issued patent to Hill, U.S. Pat. No. 4,032,850, which, like Neuf and others, utilizes baluns to connect both the RF and LO inputs to a diode bridge.

Various other microstrip and stripline construction techniques applicable to microwave mixers are taught in the U.S. Pat. Nos. to Carpenter et al., 3,634,768; Vendelin, 3,571,722; Hunton et al., 3,678,395; Shinkawa et al., 4,008,438; and Shinkawa et al., 4,031,472.

Finally, a balanced mixer is shown by Tenenholtz in U.S. Pat. No. 3,706,042 using a pair of quadrature hybrid mixers. In the Tenenholtz mixer, the signals are coupled to the quadrature hybrid mixers by first and second quadrature hybrid elements in a balanced configuration. It should be noted that the diodes used are configured in a star arrangement having a common interconnection point, but nevertheless, a balanced input for both signals is deemed necessary.

SUMMARY OF THE INVENTION

In light of the above, therefore, it is an object of the invention to provide a signal converter having unbalanced and balanced input signals coupled to a pair of input ports of a quad diode race or bridge.

It is another object of the invention to provide such a converter which can be achieved, in part, by printed circuit board microstrip fabrication techniques.

It is still another object of the invention to provide a doubly balanced mixer using a quad diode race or bridge to which connections can be easily physically achieved, which is of planar structure, and which does not require special techniques for establishing diode connections on both sides of a printed circuit board or the like.

It is a further object of the invention to provide a doubly balanced mixer which requires only one balun connection for coupling an input signal to a quad diode race or bridge.

These and other objects, features, and advantages will become apparent to those skilled in the art from the following detailed description when read in conjunction with the appended claims and accompanying drawings.

BRIEF DESCRIPTION OF THE DRAWING

The invention is illustrated in the accompanying drawings, wherein.

DETAILED DESCRIPTION OF THE PREFERRED EMBODIMENTS

The invention is hereinafter described with reference to a doubly balanced mixer circuit to derive an intermediate frequency (IF) signal from a radio frequency (RF) signal and a local oscillator (LO) signal, using a quad diode race or bridge, for use, typically, in the 500 to 5000 MHz region. Such signals, bridge, and the mixing dynamics thereof are known in the art, and are not described further herein. It should be noted, however, that although the invention is described with particular reference to a preferred embodiment for use as a mixer, the same techniques with the quad diode bridge can equally advantageously be employed for other uses, such as modulators, converters or the like.

The mixer in accordance with the principles of the invention is used, as mentioned, in conjunction with a quad diode race 10, which includes four diodes, 11, 12, 14 and 15, connected end-to-end, anode to cathode, to form a race, as shown. The diodes are illustrated as being connected at corners 17, 18, 20, and 21, to present two pair of input ports, 17 and 18, and 20 and 21, respectively.

Figure 1:
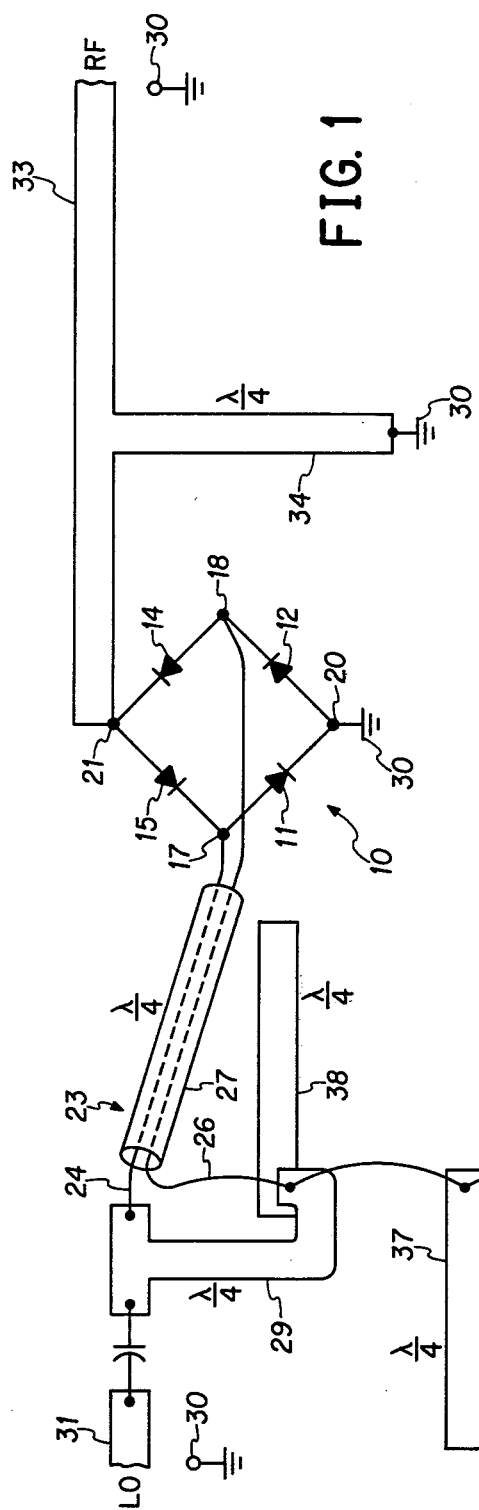
FIG. 1 is a partly pictorial, electrical schematic diagram, showing a mixer, in accordance with the principles of the invention.

The LO signal is applied to the input ports 17 and 18 by a balun 23. (The term "balun" herein is used to designate generally a transformer or element which converts signals from an unbalanced state, with one side referenced to ground, to a balanced state, with each side floating with respect to ground, or vice versa.) In the embodiment illustrated, the balun 23 may conveniently be two wires 24 and 26, held in proximity along a predetermined distance, for example, a quarter wavelength, by a piece of heat shrinkable tubing 27. Such baluns, often referred to as "hybrids", are well known in the art, and are not described herein further in detail. The LO signal is developed across a one-quarter wavelength segment 29 of conductor material, which may be, as shown, a portion of a conducting strip formed on a printed circuit board or like substrate (not shown in FIG. 1). Thus, the LO signal is applied via the balun 23 to the input ports 17 and 18 of the quad diode race 10, in a balanced state.

On the other hand, the RF signal is applied in an unbalanced state upon a conducting strip 33, between the strip and ground 30, for application to input port 21 of the quad diode race 10. The last input port 20 of the quad diode race 10 is connected to ground 30. Thus, the RF signal is applied to the quad diode race 10 in an unbalanced state, as shown. In addition, a one-quarter wavelength segment 34 is connected from the conductor 33 to ground 30 to present a dc return path to the segment 33. The one-quarter wavelength segment 34 may be located, as shown, extending from the segment 33. The segment 34 also may form a tuning stub to match the impedance of the mixer race 10 as seen at port 21 to the impedance of the input port 33.

The output from the mixer circuit is derived at the terminus of the segment 29 for delivery to IF terminals 35. If desired, a pair of quarter wavelength segments 37 and 38 can be used as shown to provide a low pass filter to the output signal. (It should be noted that chokes and bypass capacitors may also be used, if desired.)

It should be observed that the IF output is taken at an input to the balun 23. This is of interest since it simplifies the matching requirements to the quad diode race 10. If, for example, the output IF signal is derived directly from the quad diode 10, the reactances seen at the output port would necessarily have to be eliminated by matching them with the critical balun lengths or by adding additional matching structure. This is overcome by the low level removal of the IF output upon the section 29, still further simplifying the physical requirements of the quad diode race, as described below.

It should be specifically pointed out that the LO signal is applied to the pair of quad diode race input ports 17 and 18 in a balanced or floating state with respect to ground 30. On the other hand, the RF input is referenced to ground at the input port 20, from the opposite input port 21. Thus, the signals which are inputted to the quad diode race 10 are in a balanced and unbalanced state, respectively. It should be also noted that although the RF input is shown as being applied to the unbalanced input, the LO input could be so applied instead.

Figure 2:
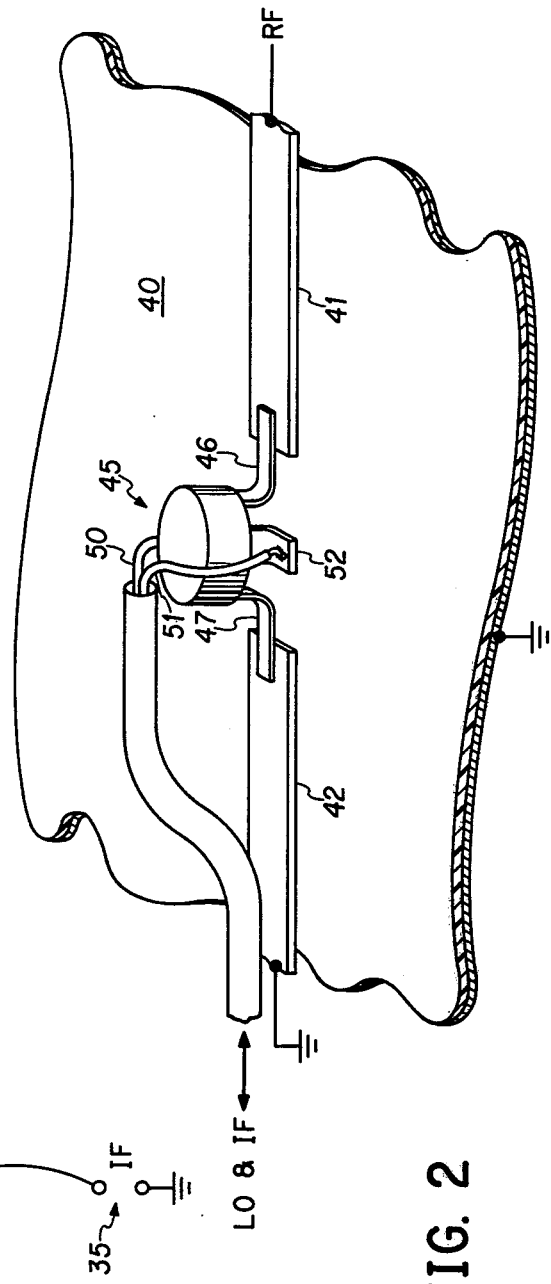
FIG. 2 is a perspective view of a mechanical mounting configuration for use in realizing the mixer in accordance with the invention.

The recognition of the possibility of operating a quad diode race in a doubly balanced mixer as above described enables the physical or mechanical mounting of the quad diode race in a mixer circuit to be easily facilitated, as shown in FIG. 2. As shown, a printed circuit board substrate 40 includes two conductor strips 41 and 42, connected, for example, to the RF source and ground, respectively. A quad diode race element 45 has two opposing tabs 46 and 47 connected respectively to the conducting strips 41 and 42. A typical quad diode which can be utilized conveniently can be of type 5082-2277, manufactured by Hewlett Packard.

Although the invention has been described and illustrated with a certain degree of particularity, it is understood that the present disclosure is made only by way of example, and that numerous changes in the arrangement and combination of parts can be made without departing from the spirit and scope of the invention as hereinafter claimed.

What is claimed is:

1. A mixer for mixing a radio frequency signal in the 500 to 5000 MHz region with a local oscillator signal to obtain an intermediate frequency signal, comprising:
   a substrate,
   a quad-diode race, carried on said substrate and having first and second pairs of input connection ports,
   said first pair of connection ports having one port connected to ground and another port connected to receive the radio frequency signal, and
   a balun connected to deliver the local oscillator frequency to said second pair of input connection ports
   said connections to said first and second pairs of input connection ports being made on a single side of said substrate.

2. The mixer of claim 1 wherein said radio frequency signal is supplied upon a printed circuit board lead.

3. The mixer of claim 2 wherein said balun is a pair of wires held in proximity for a predetermined fraction of a wavelength.

4. The mixer of claim 2 wherein said intermediate frequency is developed at an input to said balun.

5. A mixer for mixing a radio frequency signal in the 500 to 5000 MHz region with a local oscillator signal to obtain an intermediate frequency signal, comprising:
   a substrate,
   a quad-diode race carried on said substrate, having first and second pairs of input connection ports, said first pair of connection ports being adapted to receive on one side of said substrate signals having a floating reference with respect to ground, and said second pair of input connection ports being configured to receive on said one side of said substrate input signals referenced with respect to ground, and
   means for delivering said radio frequency signal and said local oscillator signal on said one side of said substrate to a respective pair of said first and second pairs of input connection ports.

6. A mixer for mixing a radio frequency signal in the 500 to 5000 MHz region with a local oscillator frequency signal to obtain an intermediate frequency signal, comprising:
   a substrate,
   a quad-diode race having two pairs of input ports adapted to receive input signals on a single side of said substrate,
   unbalanced to balanced signal delivery means connected to deliver the local oscillator frequency signal from an unbalanced end to one pair of said input ports at a balanced end, and
   unbalanced to unbalanced signal delivery means connected to deliver the radio frequency signal to another of said input ports,
   said intermediate frequency being developed at the unbalanced end of said unbalanced to balanced signal delivery means.

7. The mixer of claim 6 wherein said unbalanced to unbalanced signal delivery means comprises a conductive lead of a printed circuit board referenced for carrying the radio frequency signal referenced to a ground potential.

8. A mixer for mixing an rf signal in the 500 to 5000 MHz region and an LO signal for obtaining an IF signal, comprising:
   a package containing a quad diode race, said package having four outstanding tabs, each connecting to a respective connection port of the quad diode race,
   a substrate,
   a pair of axially aligned conducting leads formed on one side of said substrate adapted to be connected respectively to said rf signal and a ground potential, two of said tabs being connected to said pair of conducting leads, on said one side of said substrate, and a balun, disposed adjacent said substrate on the same said one side as said connection of said two tabs, said balun being connected to the other two of said two tabs on said same one side of said substrate.

9. A signal converter for processing first and second signals in the 500 to 5000 MHz region to obtain a third signal, comprising:

a substrate, a quad diode race carried upon one side of said substrate, having first and second pairs of input ports;

said first pair of input ports having one port connected to ground and another port connected to receive the first signal;

and a balun connected to deliver the second signal to said second pair of input ports said connections to said first and second pairs of input ports being made on said one side of said substrate.

* * * * *